(12) United States Patent
Murphy et al.

(10) Patent No.: US 11,114,591 B2
(45) Date of Patent: Sep. 7, 2021

(54) CORE-SHELL MATERIALS WITH RED-EMITTING PHOSPHORS

(71) Applicant: Current Lighting Solutions, LLC, East Cleveland, OH (US)

(72) Inventors: James Edward Murphy, Niskayuna, NY (US); William Winder Beers, Chesterland, OH (US); William Erwin Cohen, Solon, OH (US)

(73) Assignee: CURRENT LIGHTING SOLUTIONS, LLC, East Cleveland, OH (US)

( * ) Notice: Subject to any disclaimer, the term of this patent is extended or adjusted under 35 U.S.C. 154(b) by 173 days.

(21) Appl. No.: 15/238,989

(22) Filed: Aug. 17, 2016

(65) Prior Publication Data
US 2018/0053881 A1    Feb. 22, 2018

(51) Int. Cl.
| H01L 33/50 | (2010.01) |
| C09K 11/02 | (2006.01) |
| C09K 11/61 | (2006.01) |
| C09K 11/77 | (2006.01) |
| H01L 33/56 | (2010.01) |

(52) U.S. Cl.
CPC ............ *H01L 33/504* (2013.01); *C09K 11/02* (2013.01); *C09K 11/617* (2013.01); *C09K 11/7774* (2013.01); *H01L 33/56* (2013.01); *H01L 33/502* (2013.01); *H01L 2933/005* (2013.01); *H01L 2933/0041* (2013.01)

(58) Field of Classification Search
CPC . C09K 11/617; C09K 11/7774; H01L 33/504; H01L 33/56; H01L 2933/0041; H01L 2933/005
See application file for complete search history.

(56) References Cited

U.S. PATENT DOCUMENTS

| 6,774,556 B2 | 8/2004 | Srivastava et al. |
| 7,144,121 B2 | 12/2006 | Minano et al. |
| 7,358,542 B2 | 4/2008 | Radkov et al. |
| 7,497,973 B2 | 3/2009 | Radkov et al. |
| 7,544,310 B2 | 6/2009 | Hirosaki |
| 7,648,649 B2 | 1/2010 | Radkov et al. |
| 7,857,994 B2 | 12/2010 | Setlur et al. |
| 8,237,348 B2 | 8/2012 | Masuda et al. |
| 8,252,613 B1* | 8/2012 | Lyons ............... C09K 11/617 438/46 |
| 8,309,724 B2* | 11/2012 | Padi ................. C07D 487/04 544/350 |
| 8,506,104 B1 | 8/2013 | Murphy et al. |
| 8,703,016 B2 | 4/2014 | Nammalwar et al. |
| 8,710,487 B2 | 4/2014 | Lyons et al. |
| 8,906,724 B2* | 12/2014 | Murphy ............. H01L 33/52 438/34 |
| 2009/0020775 A1 | 1/2009 | Radkov et al. |
| 2014/0231857 A1 | 8/2014 | Nammalwar et al. |
| 2015/0054400 A1 | 2/2015 | Murphy |
| 2015/0372199 A1 | 12/2015 | Meyer et al. |
| 2016/0003422 A1 | 1/2016 | Srivastava et al. |
| 2016/0024378 A1 | 1/2016 | Murphy |
| 2016/0281962 A1* | 9/2016 | Tseng ................. H01J 1/63 |

FOREIGN PATENT DOCUMENTS

CN    105586040    *    5/2016

OTHER PUBLICATIONS

Translation for CN 105586040, May 18, 2016.*
Liao et al., "Synthesis of K2SiF6:Mn4+ Phosphor from SiO2 Powders via Redox Reaction in HF/KMnO4 Solution and Their Application in Warm-White LED", Journal of the American Ceramic Society, vol. 96, Issue: 11, pp. 3552-3556, Nov. 2013.
Jian, L., et al., "Direct white-light from core-shell-like sphere with Sr3Mg-Si208: Eu2+, Mn2+coated on Sr2SiO4:Eu2+," Optoelectronics Letters, vol. 9, No. 4, pp. 293-296 (2013).
Korthout, K., et al., "Rare earth doped core-shell particles as phosphor for warm-white light-emitting diodes," Applied Physics Letters, vol. 98, No. 26, pp. 1-3 (2011).
Wang, L., et al., "Highly efficient narrow-band green and red phosphors enabling wider color-gamut LED backlight for more brilliant displays," Optics Express, vol. 23, No. 22, pp. 1-11 (Oct. 23, 2015).
International Search Report and Written Opinion issued in connection with corresponding PCT Application No. PCT/US2017/051706 dated May 9, 2018.

* cited by examiner

Primary Examiner — C Melissa Koslow
(74) Attorney, Agent, or Firm — Buckley, Maschoff & Talwalkar LLC

(57) ABSTRACT

A coated phosphors that include a shell comprising a first $Mn^{4+}$ doped phosphor of formula I $$A_x[MF_y]:Mn^{4+} \qquad \text{I}$$

directly disposed on a core comprising a second phosphor. The second phosphor is a material other than a compound of formula I or formula II $$A_x[MF_y] \qquad \text{II}$$

wherein
A is, independently at each occurrence, Li, Na, K, Rb, Cs, or a combination thereof;
M is, independently at each occurrence, Si, Ge, Sn, Ti, Zr, Al, Ga, In, Sc, Hf, Y, La, Nb, Ta, Bi, Gd, or a combination thereof;
x is the absolute value of the charge of the $[MF_y]$ ion; and
y is 5, 6 or 7.

12 Claims, 4 Drawing Sheets

CORE-SHELL MATERIALS WITH RED-EMITTING PHOSPHORS

BACKGROUND

Red-emitting phosphors based on complex fluoride materials activated by $Mn^{4+}$, such as those described in U.S. Pat. Nos. 7,358,542, 7,497,973, and 7,648,649, can be utilized in combination with yellow/green emitting phosphors such as YAG:Ce or other garnet compositions to achieve warm white light (CCTs<5000 K on the blackbody locus, color rendering index (CRI) >80) from a blue LED, equivalent to that produced by current fluorescent, incandescent and halogen lamps. These materials absorb blue light strongly and efficiently emit between about 610-635 nm with little deep red/NIR emission. Therefore, luminous efficacy is maximized compared to red phosphors that have significant emission in the deeper red where eye sensitivity is poor. Quantum efficiency can exceed 85% under blue (440-460 nm) excitation LED packages that contain blends of the red-emitting phosphors with other phosphors may experience problems including phase segregation and light scattering due to refractive index mismatch between phosphors and binder materials. Accordingly, there is a need for phosphors that can mitigate problems that can arise with blends.

BRIEF DESCRIPTION

Briefly, in one aspect, the present invention relates to coated phosphors that include a shell comprising a first $Mn^{4+}$ doped phosphor of formula I $$A_x[MF_y]:Mn^{4+} \qquad \qquad I$$

directly disposed on a core comprising a second phosphor. The second phosphor is a material other than a compound of formula I or formula II $$A_x[MF_y] \qquad \qquad II$$

For the compounds of formula I and II,
  A is, independently at each occurrence, Li, Na, K, Rb, Cs, or a combination thereof;
  M is, independently at each occurrence, Si, Ge, Sn, Ti, Zr, Al, Ga, In, Sc, Hf, Y, La, Nb, Ta, Bi, Gd, or a combination thereof;
  x is the absolute value of the charge of the $[MF_y]$ ion; and
  y is 5, 6 or 7.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
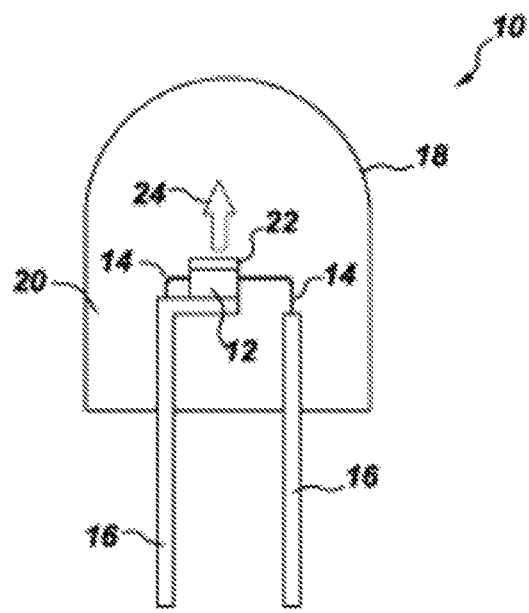
FIG. 1 is a schematic cross-sectional view of a lighting apparatus in accordance with one embodiment of the invention.

The $Mn^{4+}$ doped phosphors of formula I that make up the shell of the coated phosphors are coordination compounds containing at least one coordination center surrounded by fluoride ions acting as ligands, and charge-compensated by counter ions as necessary. In one example, $K_2SiF_6:Mn^{4+}$, the coordination center is Si and the counterion is K. The $Mn^{4+}$ activator ion also acts as a coordination center, substituting part of the centers of the host lattice, for example, Si. The host lattice, including the counter ions, may further modify the excitation and emission properties of the activator ion.

The amount of manganese in the phosphors of formula I ranges from about 1 mol % to about 30 mol %, particularly from about 3 mol % to about 20 mol %. In embodiments where the phosphor formula I is $K_2SiF_6:Mn^{4+}$, the amount of manganese ranges from about 1 mol % (about 0.25 wt %) to about 25 mol % (about 6 wt %), particularly from about 2 mol % (about 0.5 wt %) to about 20 mol (about 5 wt %), and more particularly from about 2 mol % (about 0.5 wt %) to about 4 wt % (about 16.5 mol %).

In particular embodiments, the coordination center of the phosphor, that is, M in formula I, is Si, Ge, Sn, Ti, Zr, or a combination thereof. More particularly, the coordination center is Si, Ge, Ti, or a combination thereof, and the counterion, or A in formula I, is Na, K, Rb, Cs, or a combination thereof, and y is 6. Examples of phosphors of formula I include $K_2SiF_6:Mn^{4+}$, $K_2TiF_6:Mn^{4+}$, $K_2SnF_6:Mn^{4+}$, $Cs_2TiF_6$, $Rb_2TiF_6$, $Cs_2SiF_6$, $Rb_2SiF_6$, $Na_2TiF_6:Mn^{4+}$, $Na_2ZrF_6:Mn^{4+}$, $K_3ZrF_7:Mn^{4+}$, $K_3BiF_6:Mn^{4+}$, $K_3YF_6:Mn^{4+}$, $K_3LaF_6:Mn^{4+}$, $K_3GdF_6:Mn^{4+}$, $K_3NbF_7:Mn^{4+}$, $K_3TaF_7:Mn^{4+}$. In particular embodiments, the phosphor of formula I is $K_2SiF_6:Mn^{4+}$.

In some embodiments, the core of the coated phosphor is composed of a phosphor that emits in the green range. Such coated phosphors have emission in both the yellow-green and red ranges, and, when used in combination with a blue LED, may not require other phosphors to produce white light. Examples of green phosphors that may form the core include $Ce^{3+}$-doped garnets, and $Eu^{2+}$-doped oxynitride phosphors. Suitable $Ce^{3+}$-doped garnets include $Ce^{3+}$-doped yttrium aluminum garnets, particularly $(Y,Gd,Tb,La,Sm,Pr,Lu)_3(Al,Ga)_{5-\alpha}O_{12-3/2\alpha}:Ce^{3+}$ (wherein $0 \leq \alpha \leq 0.5$), more particularly $Ce^{3+}$-doped yttrium aluminum garnets. $Eu^{2+}$-doped oxynitride phosphors include $Eu^{2+}$-doped β-SiAlON phosphors such as those described in U.S. Pat. No. 7,544,310, and other patents assigned to National Institute for Materials Science, and U.S. Pat. No. 8,237,348, and other patents assigned to Sharp Kabushiki Kaisa.

In other embodiments, the core of the coated phosphor includes $(Sr,Ca)S:Eu^{2+}$. other embodiments, the core of the coated phosphor is composed of a $Eu^{2+}$-doped nitride phosphor that emits in the red range. Examples of red phosphors that may form the core include $Eu^{2+}$-doped nitride phosphors such as $(Ba, Sr)_2Si_5N_8:Eu^{2+}$, $(Ca, Sr)AlSiN_3:Eu^{2+}$, $Sr[LiAl_3N_4]:Eu^{2+}$, and $Sr[Mg_3SiN_4]:Eu^{2+}$.

In general, the core of the coated phosphor is composed of a material other than a compound of formula I or formula II that is stable to conditions for preparing the coating which may include exposure to strong acids such as HF, oxidizing agents such as fluorine gas, and high temperatures. The coated phosphors may be prepared by contacting a suspension of the phosphor that will form the core of the coated phosphor in a HF solution with a source of $Mn^{4+}$, $A^+$, and M. In some embodiments, the phosphors are prepared by gradually adding a first solution containing a source of M and HF and a second solution containing a source of Mn to the suspended core phosphor in the presence of a source of A, to form the coated phosphor.

Materials for use as the source of Mn include for example, $K_2MnF_6$, $KMnO_4$, $K_2MnCl_6$, $MnF_4$, $MnF_3$, $MnF_2$, $MnO_2$, and combinations thereof, and, in particular, $K_2MnF_6$. Where the shell phosphor is $K_2SiF_6$, the source of M may be a compound containing Si, having good in solubility in the solution, for example, $H_2SiF_6$, $Na_2SiF_6$, $(NH_4)_2SiF_6$, $Rb_2SiF_6$, $Cs_2SiF_6$, $SiO_2$ or a combination thereof, particularly $H_2SiF_6$. Use of $H_2SiF_6$ is advantageous because it has very high solubility in water, and it contains no alkali metal element as an impurity. The source of M may be a single compound or a combination of two or more compounds. Amounts of the raw materials used generally correspond to the desired composition, except that in some embodiments, an excess of the source of A may be present.

The coated phosphors may be subjected to post-synthesis processing that may increase color stability of the phosphor of formula I without harm to the phosphor of the core. In particular, the coated phosphor may be contacted with a fluorine-containing oxidizing agent in gaseous form at an elevated temperature as described in U.S. Pat. No. 8,906,724. The temperature ranges from about 200° C. to about 700° C., particularly from about 350° C. to about 700° C. during contact, and in some embodiments from about 500° C. to about 700° C. The phosphor is contacted with the oxidizing agent for a period of time sufficient to convert it to a color stable phosphor. Time and temperature are interrelated, and may be adjusted together, for example, increasing time while reducing temperature, or increasing temperature while reducing time. In particular embodiments, the time is at least one hour, particularly for at least four hours, more particularly at least six hours, and most particularly at least eight hours.

The fluorine-containing oxidizing agent may be $F_2$, HF, $SF_6$, $BrF_5$, $NH_4HF_2$, KF, $AlF_3$, $SbF_5$, $ClF_3$, $BrF_3$, KrF, $XeF_2$, $XeF_4$, $NF_3$, $SiF_4$, $PbF_2$, $ZnF_2$, $SnF_2$, $CdF_2$, a $C_1$-$C_4$ fluorocarbon, or a combination thereof. Examples of suitable fluorocarbons include $CF_4$, $C_2F_6$, $C_3F_8$, $CHF_3$, $CF_3CH_2F$, and $CF_2CHF$. In particular embodiments, the fluorine-containing oxidizing agent is $F_2$. The amount of oxidizing agent in the atmosphere may be varied to obtain the color stable phosphor, particularly in conjunction with variation of time and temperature. Where the fluorine-containing oxidizing agent is $F_2$, the atmosphere may include at least 0.5% $F_2$, although a lower concentration may be effective in some embodiments. In particular, the atmosphere may include at least 5% $F_2$ and more particularly at least 20% $F_2$. The atmosphere may additionally include nitrogen, helium, neon, argon, krypton, xenon, in any combination with the fluorine-containing oxidizing agent. In particular embodiments, the atmosphere is composed of about 20% $F_2$ and about 80% nitrogen.

The coated phosphor may be treated with a solution of a compound of formula II in aqueous hydrofluoric acid, as described in U.S. Pat. Nos. 8,252,613, 8,710,487, and US 2015/0054400 before or after contacting with the fluorine-containing oxidizing agent, or both before and after. The solution may be saturated or nearly saturated. A nearly saturated solution is one that contains 1-10% solvent in excess of the amount required to make a saturated solution. The temperature at which the phosphor is contacted with the solution is not particularly limited and may be selected according to convenience, although other parameters such as time or concentration may be adjusted at high or low temperatures to yield the desired properties of the phosphor. In particular embodiments, the temperature ranges from about 20° C. to about 50° C. The period of time required to treat the phosphor ranges from about one minute to about five hours, particularly from about five minutes to about one hour. Concentration of hydrofluoric acid in the aqueous HF solutions ranges from about 20% w/w to about 70% w/w, particularly about 40% w/w to about 70% w/w.

A lighting apparatus or light emitting assembly or lamp 10 according to one embodiment of the present invention is shown in FIG. 1. Lighting apparatus 10 includes a semiconductor radiation source, shown as light emitting diode (LED) chip 12, and leads 14 electrically attached to the LED chip. The leads 14 may be thin wires supported by a thicker lead frame(s) 16 or the leads may be self-supported electrodes and the lead frame may be omitted. The leads 14 provide current to LED chip 12 and thus cause it to emit radiation.

The lamp may include any semiconductor blue or UV light source that is capable of producing white light when its emitted radiation is directed to the phosphor. In one embodiment, the semiconductor light source is a blue emitting LED doped with various impurities. Thus, the LED may comprise a semiconductor diode based on any suitable III-V, II-VI or IV-IV semiconductor layers and having an emission wavelength of about 250 to 550 nm. In particular, the LED may be an indium gallium (aluminum) nitride compound semiconductor having an emission wavelength greater than about 250 nm and less than about 550 nm. In particular embodiments, the chip is a near-uv or blue emitting LED having a peak emission wavelength from about 400 to about 500 nm. Such LED semiconductors are known in the art. The radiation source is described herein as an LED for convenience. However, as used herein, the term is meant to encompass all semiconductor radiation sources including, e.g., semiconductor laser diodes. Further, although the general discussion of the exemplary structures of the invention discussed herein is directed toward inorganic LED based light sources, it should be understood that the LED chip may be replaced or supplemented by another radiation source unless otherwise noted and that any reference to semiconductor, semiconductor LED, or LED chip is merely representative of any appropriate radiation source, including, but not limited to, organic light emitting diodes.

In lighting apparatus 10, phosphor composition 22 is radiationally coupled to the LED chip 12. Radiationally coupled means that the elements are associated with each other so radiation from one is transmitted to the other. Phosphor composition 22 is deposited on the LED 12 by any appropriate method. For example, a water based suspension of the phosphor(s) can be formed, and applied as a phosphor layer to the LED surface. In one such method, a silicone slurry in which the phosphor particles are randomly suspended is placed around the LED. This method is merely exemplary of possible positions of phosphor composition 22 and LED 12. Thus, phosphor composition 22 may be coated over or directly on the light emitting surface of the LED chip 12 by coating and drying the phosphor suspension over the LED chip 12. In the case of a silicone-based suspension, the suspension is cured at an appropriate temperature. Both the shell 18 and the encapsulant 20 should be transparent to allow white light 24 to be transmitted through those elements. Although not intended to be limiting, in some embodiments, the median particle size of the phosphor composition ranges from about 1 to about 50 microns, particularly from about 15 to about 35 microns.

In other embodiments, phosphor composition 22 is interspersed within the encapsulant material 20, instead of being formed directly on the LED chip 12. The phosphor (in the form of a powder) may be interspersed within a single region of the encapsulant material 20 or throughout the entire volume of the encapsulant material. Blue light emitted by the LED chip 12 mixes with the light emitted by phosphor composition 22, and the mixed light appears as white light. If the phosphor is to be interspersed within the material of encapsulant 20, then a phosphor powder may be added to a polymer or silicone precursor, loaded around the LED chip 12, and then the polymer precursor may be cured to solidify the polymer or silicone material. Other known phosphor interspersion methods may also be used, such as transfer loading.

In some embodiments, the encapsulant material 20 is a silicone matrix having an index of refraction R, and, in addition to phosphor composition 22, contains a diluent material having less than about 5% absorbance and index of refraction of R±0.1. The diluent material has an index of refraction of ≤1.7 particularly ≤1.6, and more particularly ≤1.5. In particular embodiments, the diluent material is of formula II, and has an index of refraction of about 1.4. Adding an optically inactive material to the phosphor/silicone mixture may produce a more gradual distribution of light flux through the phosphor/encapsulant mixture and can result in less damage to the phosphor. Suitable materials for the diluent include fluoride compounds such as LiF, $MgF_2$, $CaF_2$, $SrF_2$, $AlF_3$, $K_2NaAlF_6$, $KMgF_3$, $CaLiAlF_6$, $K_2LiAlF_6$, and $K_2SiF_6$, which have index of refraction ranging from about 1.38 ($AlF_3$ and $K_2NaAlF_6$) to about 1.43 ($CaF_2$), and polymers having index of refraction ranging from about 1.254 to about 1.7. Non-limiting examples of polymers suitable for use as a diluent include polycarbonates, polyesters, nylons, polyetherimides, polyetherketones, and polymers derived from styrene, acrylate, methacrylate, vinyl, vinyl acetate, ethylene, propylene oxide, and ethylene oxide monomers, and copolymers thereof, including halogenated and unhalogenated derivatives. These polymer powders can be directly incorporated into silicone encapsulants before silicone curing.

In yet another embodiment, phosphor composition 22 is coated on a surface of the shell 18, instead of being formed over the LED chip 12. The phosphor composition is preferably coated on the inside surface of the shell 18, although the phosphor may be coated on the outside surface of the shell, if desired. Phosphor composition 22 may be coated on the entire surface of the shell or only a top portion of the surface of the shell. The UV/blue light emitted by the LED chip 12 mixes with the light emitted by phosphor composition 22, and the mixed light appears as white light. In some embodiments, the phosphor may be located in any two or all three locations or in any other suitable location, such as separately from the shell or integrated into the LED.

Figure 2:
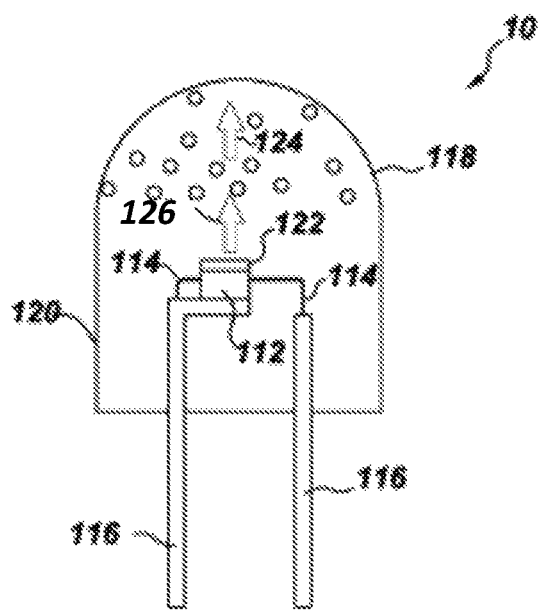
FIG. 2 is a schematic cross-sectional view of a lighting apparatus in accordance with another embodiment of the invention.

FIG. 2 illustrates a second structure of the system according to the present invention. Corresponding numbers from FIGS. 1-4 (e.g. 12 in FIG. 1 and 112 in FIG. 2) relate to corresponding structures in each of the figures, unless otherwise stated. The structure of the embodiment of FIG. 2 is similar to that of FIG. 1, except that the phosphor composition 122 is interspersed within the encapsulant material 120, instead of being formed directly on the LED chip 112. The phosphor (in the form of a powder) may be interspersed within a single region of the encapsulant material or throughout the entire volume of the encapsulant material. Radiation emitted by the LED chip 112 mixes with the light emitted by the phosphor 122, and the mixed light appears as white light 124. If the phosphor is to be interspersed within the encapsulant material 120, then a phosphor powder may be added to a polymer precursor, and loaded around the LED chip 112. The polymer or silicone precursor may then be cured to solidify the polymer or silicone. Other known phosphor interspersion methods, such as transfer molding, may also be used.

Figure 3:
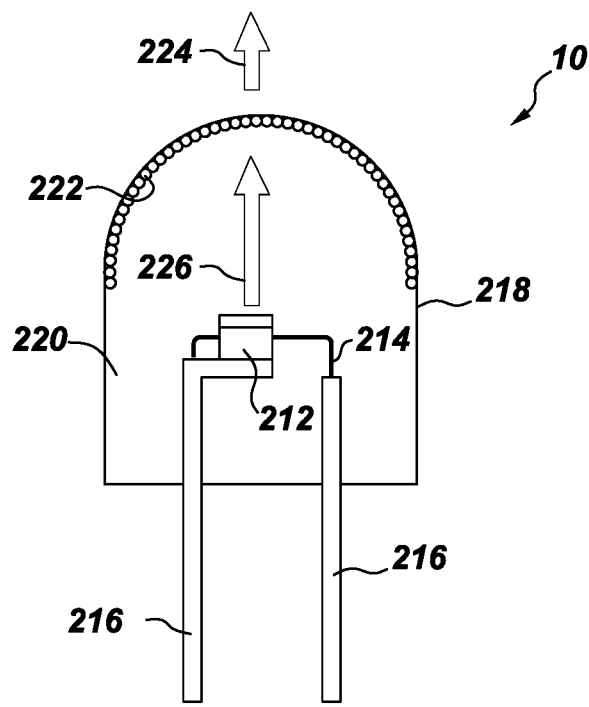
FIG. 3 is a schematic cross-sectional view of a lighting apparatus in accordance with yet another embodiment of the invention.

FIG. 3 illustrates a third possible structure of the system according to the present invention. The structure of the embodiment shown in FIG. 3 is similar to that of FIG. 1, except that the phosphor composition 222 is coated on a surface of the envelope 218, instead of being formed over the LED chip 212. The phosphor composition 222 is preferably coated on the inside surface of the envelope 218, although the phosphor may be coated on the outside surface of the envelope, if desired. The phosphor composition 222 may be coated on the entire surface of the envelope, or only a top portion of the surface of the envelope. The radiation 226 emitted by the LED chip 212 mixes with the light emitted by the phosphor composition 222, and the mixed light appears as white light 224. The structures of FIGS. 1-3 may be combined, and the phosphor may be located in any two or all three locations, or in any other suitable location, such as separately from the envelope, or integrated into the LED.

In any of the above structures, the lamp may also include a plurality of scattering particles (not shown), which are embedded in the encapsulant material. Examples of scattering particles that may be used include, but are not limited to, alumina and titania. The scattering particles effectively scatter the directional light emitted from the LED chip, preferably with a negligible amount of absorption.

Figure 4:
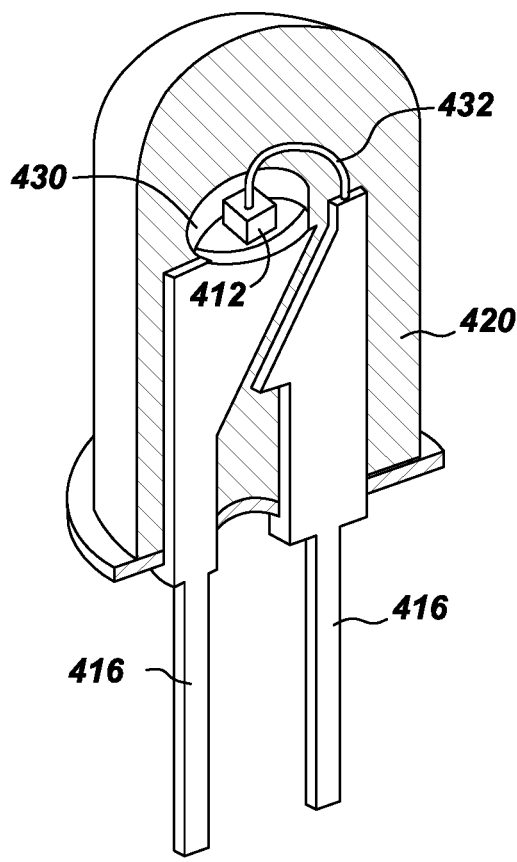
FIG. 4 is a cutaway side perspective view of a lighting apparatus in accordance with one embodiment of the invention.

As shown in a fourth structure in FIG. 4, the LED chip 412 may be mounted in a reflective cup 430. The cup 430 may be made from or coated with a dielectric material, such as alumina, titania, or other dielectric powders known in the art, or be coated by a reflective metal, such as aluminum or silver. The remainder of the structure of the embodiment of FIG. 4 is the same as those of any of the previous figures, and can include two leads 416, a conducting wire 432, and an encapsulant material 420. The reflective cup 430 is supported by the first lead 416 and the conducting wire 432 is used to electrically connect the LED chip 412 with the second lead 416.

Figure 5:
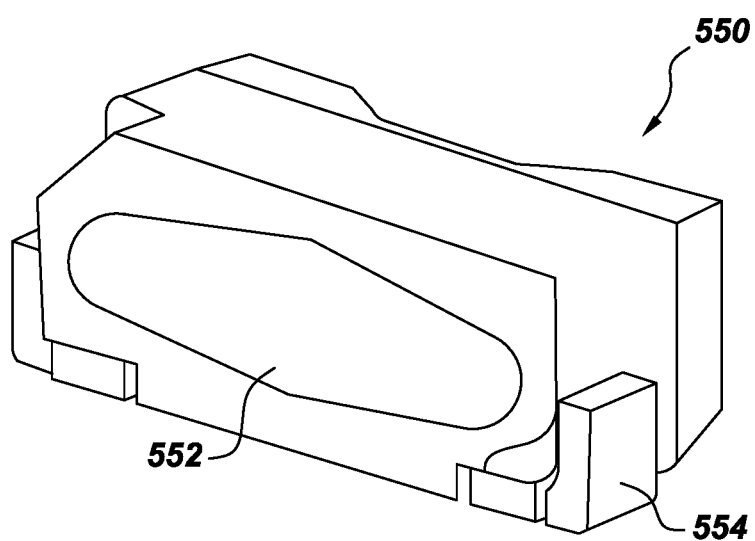
FIG. 5 is a schematic perspective view of a surface-mounted device (SMD) backlight LED.

Another structure (particularly for backlight applications) is a surface mounted device ("SMD") type light emitting diode 550, e.g. as illustrated in FIG. 5. This SMD is a "side-emitting type" and has a light-emitting window 552 on a protruding portion of a light guiding member 554. An SMD package may comprise an LED chip as defined above, and a phosphor material that includes a coated phosphor according to the present invention. Other backlight devices include, but are not limited to, TVs, computers, and handheld devices such as smartphones and tablet computers.

When used with an LED emitting at from 350 to 550 nm and one or more other appropriate phosphors, the resulting lighting system may produce a light having a white color. Lamp 10 may also include scattering particles (not shown), which are embedded in the encapsulant material. The scattering particles may comprise, for example, alumina or titania. The scattering particles effectively scatter the directional light emitted from the LED chip, preferably with a negligible amount of absorption.

In addition to the coated phosphors of the present invention, phosphor composition 22 may include one or more other phosphors. Phosphors emitting in the green, blue, yellow, red, or orange range may be used in the blend to customize the color of the emitted light and produce specific spectral power distributions. Other materials suitable for use in phosphor composition 22 include electroluminescent polymers such as polyfluorenes, preferably poly(9,9-dioctyl fluorene) and copolymers thereof, such as poly(9,9'-dioctylfluorene-co-bis-N,N'-(4-butylphenyl)diphenylamine) (F8-TFB); poly(vinylcarbazole) and polyphenylenevinylene and their derivatives. In addition, the light emitting layer may include blue, yellow, orange, green or red phosphorescent dyes or metal complexes, or combinations thereof. Materials suitable for use as the phosphorescent dye include, but are not limited to, tris(1-phenylisoquinoline) iridium (III) (red dye), tris(2-phenylpyridine) iridium (green dye) and Iridium (III) bis(2-(4,6-difluorephenyl)pyridinato-N, C2) (blue dye). Commercially available fluorescent and phosphorescent metal complexes from ADS (American Dyes Source, Inc.) may also be used. ADS green dyes include Tris(2-phenylpyridine)iridium (III)(product name ADS060GE), Tris(8-hydroxyquinolato)-aluminum (III) (product name ADS061GE), Tris(8-hydroxyquinolato)gallium(III)(product name ADS063GE), Iridium(III) tris(2-(4-tolyl) pyridinato-N,$C^2$) (product name ADS066GE), Bis(2-(9,9-dihexylfluorenyl)-1-pyridine)(acetylacetonate)iridium (III)(product name is ADS078GE), and Tris(3-methyl-1-phenyl-4-trimethyl-acetyl-5-pyrazoline)terbium(III) (product name ADS090GE). ADS blue dyes include Platinum(III) I2(4,6-difluorophenyl)pyridinato-N,$C^2$)-(acetyl-acetonate)(product name ADS064BE), Iridium (III) bis(2-(4,6-difluorophenyl)pyridinato-N,$C^2$)(product name ADS065BE), and Tris(2-(2,4-difluorophenyl)pyridine) iridium (III) (product name ADS070BE). ADS red dyes include Iridium (III) bis(2-(2'-benzo-thienyl)pyridinatoN, $C^{3'}$)(acetyl-acetonate) (product name ADS067RE), Tris(1-phenylisoquinoline)iridium (III) (product name ADS068RE), Bis(1-phenylisoquinoline)-(acetylacetonate) iridium (III) (product name ADS069RE), Iridium (III)bis (dibenzo[f,h]-quinoxaline)(acetylacetonate)(product name ADS075RE), Iridium(III)bis(2-methyldibenzo-[f,h]quinoxaline(acetylacetonate)(product name ADS076RE), and Bis-(2-(9,9-dibutylfluorenyl)-1-isoquinoline(acetylacetonate) (product name ADS077RE).

Suitable phosphors for use in phosphor composition 22 include, but are not limited to:

$((Sri_{1-z}, (Ca, Ba, Mg, Zn)_z)_{1-(x+z)}(Li, Na, K, Rb)_w Ce_x)_3 (Al_{1-y} Si_y)O_{4+y+3(x-w)}F_{1-y-3(x-w)}$, $0<x\leq1.10$, $0\leq y\leq0.5$, $0\leq z\leq0.5$, $0\leq w\leq x$;

$(Ca, Ce)_3Sc_2Si_3O_{12}(CaSiG)$;
$(Sr,Ca,Ba)_3Al_{1-x}Si_xO_{4+x}F_{1-x}:Ce^{3+}(SASOF))$;
$(Ba,Sr,Ca)_5(PO_4)_3(Cl,F,Br,OH):Eu^{2+},Mn^{2+}$; $(Ba,Sr,Ca)BPO_5:Eu^{2+},Mn^{2+}$;
$(Sr,Ca)_{10}(PO_4)_6*vB_2O_3:Eu^{2+}$ (wherein $0<v\leq1$); $Sr_2Si_3O_8*2SrCl_2:Eu^{2+}$;
$(Ca,Sr,Ba)_3MgSi_2O_8:Eu^{2+},Mn^{2+}$; $BaAl_8O_{13}:Eu^{2+}$; $2SrO*0.84P_2O_5*0.16B_2O_3:Eu^{2+}$;
$(Ba,Sr,Ca)MgAl_{10}O_{17}:Eu^{2+},Mn^{2+}$; $(Ba,Sr,Ca)Al_2O_4:Eu^{2+}$; $(Y,Gd,Lu,Sc,La)BO_3:Ce^{3+},Tb^{3+}$;
$ZnS:Cu^+,Cl^-$; $ZnS:Cu^+,Al^{3+}$; $ZnS:Ag^+,Cl^-$; $ZnS:Ag^+,Al^{3+}$; $(Ba,Sr,Ca)_2Si_{1-n}O_{4-2n}:Eu^{2+}$ (wherein $0\leq n\leq0.2$); $(Ba,Sr,Ca)_2(Mg,Zn)Si_2O_7:Eu^{2+}$; $(Sr,Ca,Ba)(Al,Ga,In)_2S_4:Eu^{2+}$;
$(Y,Gd,Tb,La,Sm,Pr,Lu)_3(Al,Ga)_{5-a}O_{12-3/2a}:Ce^{3+}$ (wherein $0\leq a\leq0.5$);
$(Ca,Sr)_8(Mg,Zn)(SiO_4)_4Cl_2:Eu^{2+},Mn^{2+}$; $Na_2Gd_2B_2O_7:Ce^{3+},Tb^{3+}$;
$(Sr,Ca,Ba,Mg,Zn)_2P_2O_7:Eu^{2+},Mn^{2+}$; $(Gd,Y,Lu,La)_2O_3:Eu^{3+},Bi^{3+}$;
$(Gd,Y,Lu,La)_2O_2S:Eu^{3+},Bi^{3+}$; $(Gd,Y,Lu,La)VO_4:Eu^{3+},Bi^{3+}$; $(Ca,Sr)S:Eu^{2+},Ce^{3+}$; $SrY_2S_4:Eu^{2+}$;
$CaLa_2S_4:Ce^{3+}$; $(Ba,Sr,Ca)MgP_2O_7:Eu^{2+},Mn^{2+}$; $(Y,Lu)_2WO_6:Eu^{3+},Mo^{6+}$;
$(Ba,Sr,Ca)_bSi_gN_m:Eu^{2+}$ (wherein $2b+4g=3m$); $Ca_3(SiO_4)Cl_2:Eu^{2+}$;
$(Lu,Sc,Y,Tb)_{2-u-v}Ce_vCa_{1+u}Li_wMg_{2-w}P_w(Si,Ge)_{3-w}O_{12-u/2}$ (where $-0.5\leq u\leq1$, $0<v<0.1$, and $0\leq w\leq0.2$); $(Y,Lu,Gd)_{2-m}(Y,Lu,Gd)Ca_mSi_4N_{6+m}Ci_{1-m}:Ce^{3+}$, (wherein $0\leq m\leq0.5$);
$(Lu,Ca,Li,Mg,Y)$, $\alpha$-SiAlON doped with $Eu^{2+}$ and/or $Ce^{3+}$; $(Ca,Sr,Ba)SiO_2N_2:Eu^{2+},Ce^{3+}$; $\beta$-SiAlON:$Eu^{2+}$, $3.5MgO*0.5MgF_2*GeO_2:Mn^{4+}$; $Ca_{1-c-f}Ce_cEu_fAl_{1+c}Si_{1-c}N_3$, (where $0\leq c\leq0.2$, $0\leq f\leq0.2$); $Ca_{1-h-r}Ce_hEu_rAl_{1-h}(Mg,Zn)_hSiN_3$, (where $0\leq h\leq0.2$, $0\leq e\leq0.2$);
$Ca_{1-2s-t}Ce_s(Li,Na)_sEu_tAlSiN_3$, (where $0\leq s\leq0.2$, $0\leq t\leq0.2$, $s+t>0$); and $(Sr, Ca)AlSi N_3:Eu^{2+},Ce^{3+}$.

These phosphors may also be used as the core of a coated phosphor where conditions of the preparation reactions do not cause degradation.

The ratio of each of the individual phosphors in the phosphor blend may vary depending on the characteristics of the desired light output. The relative proportions of the individual phosphors in the various embodiment phosphor blends may be adjusted such that when their emissions are blended and employed in an LED lighting device, there is produced visible light of predetermined x and y values on the CIE chromaticity diagram. A white light may be produced. This white light may, for instance, may possess an x value in the range of about 0.20 to about 0.55, and a y value in the range of about 0.20 to about 0.55. As stated, however, the exact identity and amounts of each phosphor in the phosphor composition can be varied according to the needs of the end user. For example, the material can be used for LEDs intended for liquid crystal display (LCD) backlighting. In this application, the LED color point would be appropriately tuned based upon the desired white, red, green, and blue colors after passing through an LCD/color filter combination.

The coated phosphors of the present invention may be used in applications other than those described above, as phosphors for fluorescent lamps, cathode ray tubes, plasma display or liquid crystal display (LCD) devices. The materials may also be used as scintillators for electromagnetic calorimeters, gamma ray cameras, computed tomography scanners or laser devices.

EXAMPLES

Example 1

YAG Phosphor with Light Coating of PFS Phosphor

A $Ce^{3+}$ doped garnet (YAG) phosphor, GTP Type 9802 YAG was obtained from Global Tungsten & Powders, Towanda, Pa. The YAG powder (12 g) was added to a beaker containing 130 mL of the treatment solution described above. The suspension was stirred for 10 minutes. KF (4.5 g) was added to a beaker containing 20 mL of 48% HF while being stirred. This process is highly exothermic and the solution was allowed to cool for several minutes. $K_2MnF_6$ (1.5 g) was added to a beaker containing 30 mL of 48% HF and the solution was stirred for 5 minutes. To the stirring solution of YAG, the $K_2MnF_6$ solution was added dropwise at 4 mL/min. The KF solution was added to this same beaker at a rate of 3 mL/min after the $K_2MnF_6$ solution was dripping for 3 minutes. Upon completion of the addition of KF, the suspension was stirred for an additional 5 minutes. After stirring was stopped, the supernatant was decanted, the core shell material was vacuum filtered, rinsed once with acetic acid and twice with acetone and then dried overnight under vacuum.

A treatment solution composed of $K_2SiF_6$ dissolved in 49% HF was prepared by adding 4.2g $K_2SiF_6$ per 100 ml 49% HF to form a suspension which was vacuum filtered to remove excess solids. Approximately 2 vol % 49% HF was added to the saturated solution, to form a nearly saturated solution.

The dried phosphor was added to the treatment solution at a rate of about 6 ml solution per gram product and stirred for about 20 minutes. The treated product was vacuum filtered, rinsed once with acetic acid and three times with acetone, and then dried under vacuum. The dried powder was sifted through a 170-mesh screen, and annealed under an atmosphere composed of 20% $F_2$/80% nitrogen for about 8 hours at 540° C.

The annealed material was mixed with treatment solution of 49% HF nearly saturated with $K_2SiF_6$ at a rate of about 12 ml solution per 1 g product and stirred for about 20 minutes. The treated product was vacuum filtered, rinsed once with acetic acid and three times with acetone, and then dried under vacuum. The dried powder was sifted through a 170-mesh screen.

Example 2

YAG Phosphor with Heavy Coating of PFS Phosphor

GTP Type 9802 YAG powder (12 g) was added to a beaker containing 130 mL of 48% HF. The suspension was stirred for 10 minutes. KF (8 g) was added to a second beaker containing 20 mL of 48% HF while being stirred. This process is highly exothermic. $K_2MnF_6$ (2 g) was added to a third beaker containing 30 mL of 48% HF and the solution was stirred for 5 minutes. To a $4^{th}$ beaker, 4 mL of 35% $H_2SiF_6$ was added to 12 mL of 48% HF and stirred. To the stirring solution of YAG, the $K_2MnF_6$ solution was added dropwise at 4 mL/min. After the $K_2MnF_6$ solution had been dripping for 3 minutes, addition of the KF solution to this same beaker at a rate of 3 mL/min was started. The $H_2SiF_6$ solution was added dropwise at a rate of 3 mL/min after the $K_2MnF_6$ solution was dripping for 4 minutes. Upon completion of the addition of $H_2SiF_6$, the suspension was stirred for an additional 5 minutes. After stirring had stopped, the supernatant was decanted, the core shell material was vacuum filtered, rinsed once with acetic acid and twice with acetone and then dried overnight under vacuum. The dried phosphor was treated, annealed and treated again as in Example 1.

Comparative Example 1

HF Treatment YAG Phosphor

GTP Type 9802 YAG powder (12 g) was added to beaker containing 130 mL of 48% HF. After stirring the suspension for 30 minutes, the supernatant was decanted, the treated YAG material was vacuum filtered, rinsed once with acetic acid and twice with acetone and then dried overnight under vacuum.

Particle size data was obtained using a Horiba LA-960 Laser Scattering Particle Size Distribution Analyzer. Particle size distributions for the YAG starting material, the coated phosphors of Examples 1 and 2, and the treated YAG phosphor of Comparative Example 1 are shown in Table 1.

TABLE 1

| | d10/d50/d90 (nm) |
|---|---|
| GTP Type 9802 YAG | 10.7/15/19.9 |
| Comparative Example 1 | 11.3/15.6/21 |
| Example 1 | 15.8/26.2/43 |
| Example 2 | 16/29.5/59 |

Figure 6:
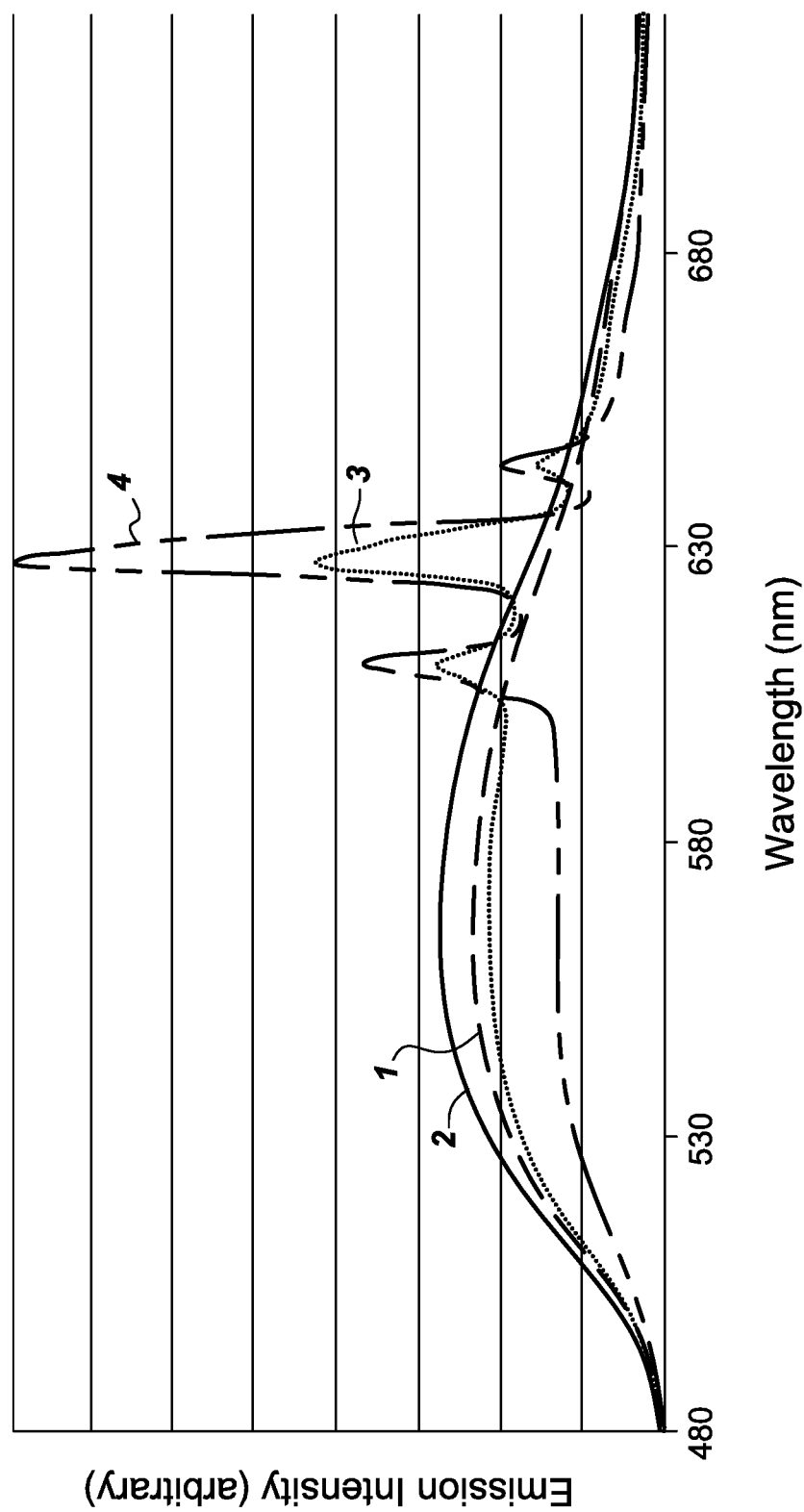
FIG. 6 is a plot showing emission spectra of coated phosphors according to the present invention.

FIG. 6 shows emission spectra of the four materials. It can be seen that YAG:Ce was not degraded after a 30 minute wash in 49% HF. Emission intensity of the HF washed YAG:Ce (Comparative Example 1) actually increased by 13%, possibly due to fines removal during decantation. The $Ce^{3+}$ emission maximum was also red-shifted by 3.5 nm. For the coated phosphors of Examples 1 and 2, the more heavily coated sample had less emission due to $Ce^{3+}$ and more emission due to $Mn^{4+}$, suggesting that the relative emission intensity of the two phosphors can be tailored.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A process for preparing a coated phosphor, the process comprising contacting a suspension of a phosphor material in particulate form in a HF solution, with a source of $Mn^{4+}$, $A^+$, and M, to form a coated phosphor having a shell comprising a first phosphor of formula I, $$A_x[MF_y]:Mn^{4+} \qquad \text{I}$$

directly disposed on a core comprising a second phosphor; and converting the coated phosphor to a color stable coated phosphor by contacting the already formed coated phosphor:
with a fluorine-containing oxidizing agent in gaseous form at an elevated temperature ranging from about 350 degrees Celsius to about 700 degrees Celsius, and with a compound of formula II, $A_x[MF_y]$ in an aqueous hydrofluoric acid, wherein the second phosphor is a material other than a compound of formula I or formula II; and $$A_x[MF_y] \qquad \text{II}$$

wherein:
contact with the compound of formula II in the aqueous hydrofluoric acid is one of: 1, before, or 2, both before and after, the coated phosphor is contacted with the fluorine-containing oxidizing agent in gaseous form at the elevated temperature ranging from about 350 degrees Celsius to about 700 degrees Celsius, A is, independently at each occurrence, Li, Na, K, Rb, Cs, or a combination thereof;

M is, independently at each occurrence, Si, Ge, Sn, Ti, Zr, Al, Ga, In, Sc, Hf, Y, La, Nb, Ta, Bi, Gd, or a combination thereof;

x is the absolute value of the charge of the $[MF_y]$ ion; and y is 5, 6 or 7.

2. The process of claim 1, wherein the second phosphor is a green phosphor.

3. The process of claim 1, wherein the second phosphor is a $Ce^{3+}$-doped garnet phosphor.

4. The process of claim 1 wherein the second phosphor is $(Y,Gd,Tb,La,Sm,Pr,Lu)_3 (Al,Ga)_{5-\alpha}O_{12-3/2\alpha}:Ce^{3+}$ (wherein $0 \leq \alpha \leq 0.5$).

5. The process of claim 1, wherein the second phosphor is a $Eu^{2+}$-doped β-SiAlON phosphor.

6. The process of claim 1, wherein the second phosphor is $CaAlSiN_3: Eu^{2+}$.

7. The process of claim 1, wherein the second phosphor is a $Eu^{2+}$-doped nitride phosphor.

8. The process of claim 1, wherein the second phosphor is $(Ba, Sr)_2Si_5N_8:Eu^{2+}$, $(Ca, Sr)AlSiN_3:Eu^{2+}$, $Sr[LiAl_3N_4]:Eu^{2+}$, $Sr[Mg_3SiN_4]:Eu^{2+}$, $(Sr, Ca)S:Eu^{2+}$, or a combination thereof.

9. The process of claim 1, wherein M is Si, Ge, Sn, Ti, Zr, or a combination thereof.

10. The process of claim 1, wherein A is Na, K, or a combination thereof.

11. The process of claim 1, wherein
A is Na, K, Rb, Cs, or a combination thereof;
M is Si, Ge, Ti, or a combination thereof; and
Y is 6.

12. The process of claim 1, wherein the first phosphor is $K_2SiF_6:Mn^{4+}$.

* * * * *